United States Patent
Spalding, Jr. et al.

(10) Patent No.: US 10,185,340 B2
(45) Date of Patent: *Jan. 22, 2019

(54) APPARATUS AND METHOD FOR DISTRIBUTING POWER-UP POWER DISSIPATION

(71) Applicant: Analog Devices, Inc., Norwood, MA (US)

(72) Inventors: George Redfield Spalding, Jr., Edinburgh (GB); Marcus O'Sullivan, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 221 days.

This patent is subject to a terminal disclaimer.

(21) Appl. No.: 15/224,906

(22) Filed: Aug. 1, 2016

(65) Prior Publication Data

US 2017/0031375 A1 Feb. 2, 2017

Related U.S. Application Data

(63) Continuation of application No. 14/174,530, filed on Feb. 6, 2014, now Pat. No. 9,405,307, and a continuation of application No. 13/253,444, filed on Oct. 5, 2011, now Pat. No. 8,680,893.

(51) Int. Cl.
| | | |
|---|---|---|
| *H03K 17/687* | (2006.01) | |
| *G05F 1/575* | (2006.01) | |
| *H03K 17/082* | (2006.01) | |
| *H03K 17/12* | (2006.01) | |
| *G05F 1/46* | (2006.01) | |
| *H03K 3/012* | (2006.01) | |
| *H03K 19/0175* | (2006.01) | |
| *H03K 19/003* | (2006.01) | |

(52) U.S. Cl.
CPC .............. *G05F 1/575* (2013.01); *G05F 1/468* (2013.01); *H03K 17/0822* (2013.01); *H03K 17/122* (2013.01); *H03K 3/012* (2013.01); *H03K 17/687* (2013.01); *H03K 19/00315* (2013.01); *H03K 19/017509* (2013.01)

(58) Field of Classification Search
None
See application file for complete search history.

(56) References Cited

U.S. PATENT DOCUMENTS

| | | | | |
|---|---|---|---|---|
| 6,404,173 | B1 * | 6/2002 | Telefus | G05F 1/56 323/272 |
| 6,930,473 | B2 * | 8/2005 | Elbanhawy | H02M 3/1584 323/282 |
| 7,253,540 | B1 | 8/2007 | Thalheim et al. | |

(Continued)

OTHER PUBLICATIONS

"U.S. Appl. No. 13/253,444, Response filed Jul. 29, 2013 to Non Final Office Action dated Feb. 28, 2013", 13 pgs.

(Continued)

*Primary Examiner* — Tuan T Lam
(74) *Attorney, Agent, or Firm* — Schwegman Lundberg & Woessner, P.A.

(57) ABSTRACT

A connection device for connecting a load to a power supply, comprising at least first and second current control devices arranged in parallel between the power supply and the load, and a controller arranged to switch the current control devices on in sequence for temporally overlapping on periods.

20 Claims, 6 Drawing Sheets

(56) References Cited

U.S. PATENT DOCUMENTS

| | | | |
|---|---|---|---|
| 8,148,957 B2 | 4/2012 | Zhang | |
| 8,278,997 B1 * | 10/2012 | Kim | G06F 1/26 327/541 |
| 8,680,893 B2 | 3/2014 | Spalding, Jr. et al. | |
| 9,148,138 B2 * | 9/2015 | Togneri | H03K 17/122 |
| 9,405,307 B2 | 8/2016 | Spalding, Jr. et al. | |
| 2004/0085698 A1 | 5/2004 | Ball et al. | |
| 2006/0145673 A1 | 7/2006 | Fogg et al. | |
| 2007/0188198 A1 | 8/2007 | Bird | |
| 2009/0027818 A1 | 1/2009 | Adi | |
| 2009/0256616 A1 | 10/2009 | Garrett | |
| 2011/0109297 A1 * | 5/2011 | Tosuntikool | H02M 5/257 323/350 |
| 2012/0313687 A1 | 12/2012 | Togneri et al. | |
| 2013/0088278 A1 | 4/2013 | Spalding, Jr. et al. | |
| 2013/0278300 A1 * | 10/2013 | Domingo | H03K 17/0822 327/109 |
| 2014/0152280 A1 | 6/2014 | Spalding, Jr. et al. | |
| 2015/0346245 A1 * | 12/2015 | Kiep | H02M 1/08 323/271 |

OTHER PUBLICATIONS

"U.S. Appl. No. 13/253,444, Non Final Office Action dated Feb. 28, 2013", 12 pgs.

"U.S. Appl. No. 13/253,444, Notice of Allowance dated Nov. 7, 2013", 15 pgs.

"U.S. Appl. No. 14/174,530, Non Final Office Action dated Nov. 18, 2015", 6 pgs.

"U.S. Appl. No. 14/174,530, Notice of Allowance dated Mar. 29, 2016", 7 pgs.

"U.S. Appl. No. 14/174,530, Preliminary Amendment filed Feb. 7, 2014", 8 pgs.

"U.S. Appl. No. 14/174,530, Response filed Jan. 29, 2016 to Non Final Office Action dated Nov. 18, 2015", 12 pgs.

U.S. Appl. No. 14/174,530, U.S. Pat. No. 9,405,307, filed Feb. 6, 2014, Apparatus and Method for Distributing Power-Up Power Dissipation.

U.S. Appl. No. 13/253,444, U.S. Pat. No. 8,680,893, filed Oct. 5, 2011, Circuits and Techniques for Load Current Control.

* cited by examiner

APPARATUS AND METHOD FOR DISTRIBUTING POWER-UP POWER DISSIPATION

CLAIM OF PRIORITY AND RELATED APPLICATIONS

This patent application is a continuation of Spalding, U.S. patent application Ser. No. 14/174,530, entitled "APPARATUS AND METHOD FOR DISTRIBUTING POWER-UP POWER DISSIPATION," filed on Feb. 6, 2014, now U.S. Pat. No. 9,405,307, which claims the benefit of priority of Spalding, U.S. patent application Ser. No. 13/253,444, entitled "CONNECTION DEVICE," filed on Oct. 5, 2011, now U.S. Pat. No. 8,680,893, which are hereby incorporated by reference herein in their entirety.

FIELD OF THE INVENTION

The present invention relates to a connection device for enabling power to be supplied to an electrical load.

BACKGROUND OF THE INVENTION

There are instances when it is desired to connect an electrical load to a power supply that is already on. This can give rise to large inrush currents as capacitive components of the load charge up. Such capacitive components may be real or parasitic components.

Such inrush currents can perturb the operation of the power supply, possibly causing protective measures within the power supply to trip. Furthermore the inrush currents may introduce perturbations in the power supplied to other loads connected to the power supply, and these perturbations may effect the operation of those circuits. Furthermore, if the newly introduced load is faulty, its fault may also effect the operation of the power supply and the other loads or circuits connected to the supply.

In order to address these issues it is known to provide "hot swap" circuits that regulate the current flow to a load that is newly introduced to a power supply.

SUMMARY OF THE INVENTION

According to a first aspect of the present invention there is provided a connection device for connecting a load to a power supply, the connection device comprising at least first and second current control devices arranged in parallel between the power supply and the load, and a controller arranged to operate the current control devices in sequence for temporally overlapping periods.

It is thus possible to provide an improved hot swap circuit that can ensure that each current control device is maintained within a safe operating area, i.e. that it does not become so stressed that its operation becomes compromised. Preferably the current control devices are semiconductor devices.

There is no presumption that the inrush current control has been completed at the end of a first period representing the duration for which a designer has assessed that the first semiconductor device can be safely used for. Consequently the responsibility for controlling the current build to the load is passed from one semiconductor device to a subsequent device.

Advantageously N semiconductor devices, where N is greater than or equal to 2, are provided and the devices are operated in a time multiplexed, but interleaved manner. Each device may be assigned an individual device time limit. At the end of the device time limit the next device in the sequence is used to control the evolution of the current in the load, voltage across the load or a combination thereof. The sequence of passing control from one device to the next may continue until such time as either the voltage across the load has reached the power supply voltage or is within an acceptable margin of the supply voltage, or a time out period has expired. The time out period represents the sum of the individual device time limits.

In the event of the voltage across the load reaching the supply voltage within an acceptable time period, then the load can be assumed to be "good" and the connection device can assume a steady "on" state in which one or more of the semiconductor devices are maintained in a "switched on" state, where the resistance measured across the device is very low, and the voltage measured across the device is negligible. Thus the device is acting like a switch, lithe voltage across the load has not risen to substantially the supply voltage within the time out period, then the load is assumed to be "bad" and the controller de-powers the load. Advantageously the controller marks the load as "bad" and makes no further attempt to power up the load, unless given specific instructions to make a further attempt.

Preferably the semiconductor devices are field effect transistors. Advantageously the field effect transistors are chosen for their switching performance. Such transistors exhibit a very low drain to source resistance when driven with an appropriate gate voltage. However such devices tend to perform less well during the transition from being fully off to fully on, and they are more susceptible to dissipation related damage than more general purpose field effect transistors.

Advantageously the field effect transistors have a drain to source on resistance of less than 5 mΩ when fully "on", such an "on" state possibly including being driven with an enhanced gate voltage.

The controller may be arranged to cause the load voltage to ramp up at a predetermined rate. Preferably the controller may be arranged to cause the current consumed by the load to change at a predetermined rate or be at a predetermined value until such time as the load becomes fully powered, i.e. the supply voltage to the load has substantially reached the voltage from the power supply.

The connection device may be included as part of a power supply. Alternatively the connection device may be permanently associated with the load, for example by being embedded within the load or being in a module or circuit board to which the load is attached. Alternatively the connection device may be provided as part of an intermediate unit. The intermediate unit may, for example, be a USB hub. The issue of inrush currents and the perturbations that they cause occurs across all range of loads and all ranges of voltages. Thus the present invention finds utility from relatively high voltage and current environments, such as "blades" within a "blade server" down to low voltage and low current applications such as USB peripherals attached to a USB port.

Furthermore the connection device can be provided as a distributed component such that, for example, the controller may be provided separately from the N semiconductor devices. Thus the controller may, for example, be provided as part of a power supply whilst the N semiconductor devices may be on a circuit board carrying a load that is powered by the power supply.

According to a second aspect of the present invention there is a power supply including at least one connection device as claimed in claim 1.

According to a third aspect of the present invention there is provided a circuit or a circuit board including a connection device as claimed in claim 1.

According to a fourth aspect of the present invention there is provided a controller for controlling N semiconductor devices, so as to control the evolution of current in or voltage across a load connected to a power supply, wherein the controller is arranged to use a first device during a first time period to control inrush currents, and at the end of the first period, to use a second device to control inrush currents, both devices being operable to pass current during a transition period.

According to a fifth aspect of the present invention there is provided a method of connecting a load to a power supply via at least first and second transistors arranged in parallel; the method comprising the sequential steps of using the first transistor for a first time period to control inrush currents, and at the end of the first time period using the second transistor to control inrush currents, the first and second transistors both being conducting for a first transition period following the first period.

BRIEF DESCRIPTION OF THE DRAWINGS

The present invention will further be described, by way of non-limiting example only, with reference to the accompanying Figures, in which.

DESCRIPTION OF EMBODIMENTS OF THE PRESENT INVENTION

Figure 1:
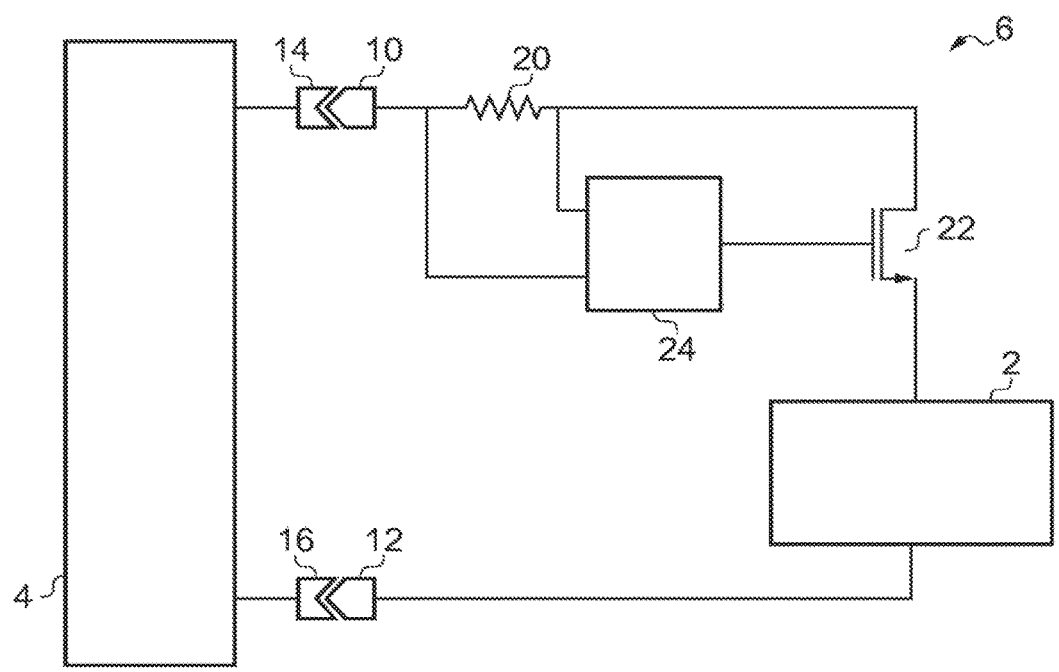
FIG. 1 is a circuit diagram of a prior art hot swap circuit.

FIG. 1 illustrates a prior art hot swap circuit for enabling a load 2 to be connected to a power supply 4. It is to be assumed that the power supply may also be supplying other components which have been omitted for simplicity. The hot swap circuit is generally designated 6 and in this arrangement is physically associated with the load 2. The combination of the load 2 and hot swap circuits 6 can be electrically connected to or disconnected from the power supply by making or breaking connections between plug components 10 and 12 and respective sockets 14 and 16 which are connected to the power supply 4.

A current sensing resistor 20 and an electrically controllable current flow device 22 are provided in series between the plug and the load 2. The electrical current flow device 22 is, in this instance, a N-type field effect transistor. A controller 24 has first and second inputs connected to either side of the current sensing resistor 20 and an output connected to the gate of the field effect transistor 22.

In use, when the load 2 and hot swap circuit 6 are introduced to the power supply 4 by virtue of the plugs 10 and 12 being introduced to the respective sockets 14 and 16, then the voltage of the power supply is provided to the controller 24, thereby powering it up and also initiating the power up sequence for the load 2. The controller 24 applies a control signal to the gate of the field effect transistor 22 in order to enable current flow to the load 2. The controller 24 monitors the voltage occurring across the current sensing resistor and, in a closed loop, controls the gate voltage of the transistor 22 such that the rate of change of current $$\frac{\partial I}{\partial t}$$

is controlled to a target value or the magnitude of the current is controlled to a target value. This prevents excessive inrush currents being drawn by the load. The load can be assumed to be fully powered when it is no longer possible to get the rate of current increase or the current to attain the target value.

A problem with such an arrangement is that a large amount of power may be dissipated in the transistor 22 during the inrush control period. To put this in context, it can be seen that when the load is fully powered, although the currents flowing through the transistor 22 may be quite high, the voltage across the transistor is very small. Thus the amount of energy dissipated in the transistor is quite low. In fact, for modern switching field effect transistors the drain to source on resistance may be in the order of just a few milli-ohms. Consequently the power dissipation as given by $I^2R$ remains low. Similarly, it can be seen that if the transistor was fully off then although the voltage across the transistor might be quite high, the current through it would be zero and consequently there would be no dissipation. However during the period of where the transistor is performing inrush current limiting, the currents through the transistor 22 may be quite high, and the voltage across the transistor may be quite significant. Under such circumstances, the power dissipation within the transistor may be sufficiently high to warm the device such that it becomes thermally stressed. Thermal stressing is a product of the amount of power being dissipated in the transistor and the time for which that power is dissipated.

Figure 2:
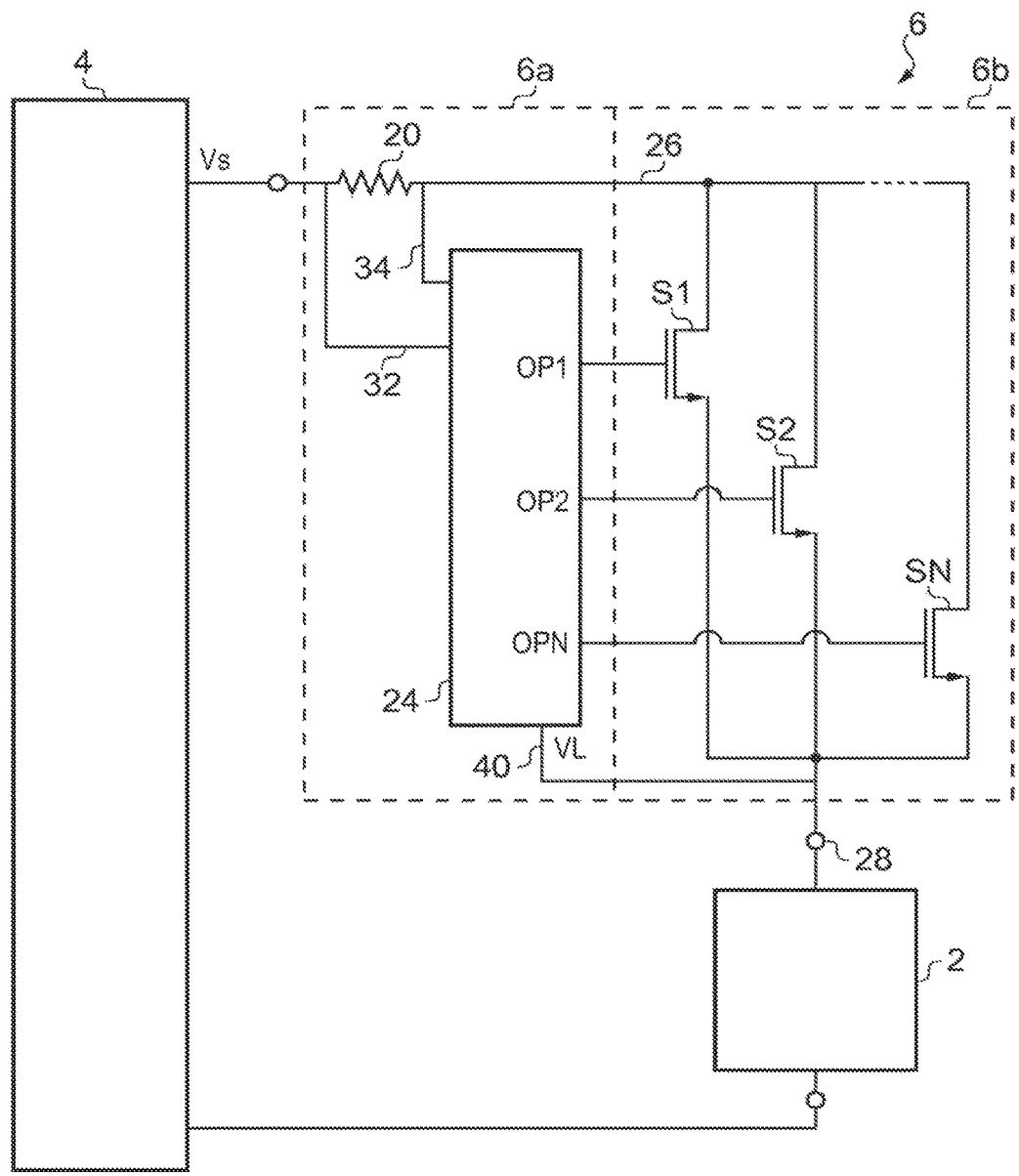
FIG. 2 is a circuit diagram of a connection device constituting an embodiment of the present invention.

FIG. 2 is a circuit diagram of a connection device constituting an embodiment of the present invention. Similar numbers have been used for like parts. The connection device 6 has been drawn as being separate from either the load 2 or the power supply 4. This is to indicate that the connection device 6 may be a stand alone component. Alternatively it may be integrated into the load 2, as shown in FIG. 1, or form part of the power supply 4. Where the connection device 6 is associated with the load, for example by being part of it, the controller 24 is allowed to power up whilst holding the semiconductor devices S1 to SN in a non-conducting state. Once the controller has powered up, it may then proceed to control the operation of the semiconductor devices to power up the load.

The connection device can itself be divided down into a control module 6a and a current switching/limiting module 6b and these modules may be separable and may be embedded in other components. Thus the control module 6a can be provided as part of the power supply and the current switching/limiting module 6b can be provided as part of the load.

As before, a current sensing resistor 20 is provided in the supply rail between the power supply 4 and semiconductor devices S1 to SN. Equally, the current sensing resistor could be provided between the devices S1 to SN and the load. This is an implementational choice made by the circuit designer. It should be noted that the invention is not limited to use of current sensing resistors in order to determine the load current, although as they are robust and inexpensive they represent the most likely current measurement technology. Other technologies such as magnetic field sensing devices may also be used.

As shown, a plurality of devices S1, S2 to SN are provided in parallel thereby providing parallel current paths from a supply rail 26 to an output node 28 connected to the load 2. The number of parallel switches is choosable by the designer, the minimum number of devices being 2.

The controller 24 has a first input 32 connected to a first side of the current sensing resistor 20 and a second input 34 connected to the second side of the sensing resistor 20. The controller can measure the voltage across the current sensing resistor 20 and thereby determine the current flow to the load 2. It could also measure the voltage occurring at either of the inputs 32 or 34 in order to determine when it has been connected to the power supply 4. This is more relevant for circuits which are provided as stand alone units compared to those which are provided as part of the load. The controller has first to Nth device control outputs OP1 to OPN. The first output OP1 is connected to a control terminal of the first device S1. The second output OP2 is connected to a control terminal of the second semiconductor device S2. If more than two devices are provided then the further outputs up to OPN are connected to the associated devices up to SN. In this example the semiconductor devices S1 to SN are field effect transistors having sources, drains and gates. The output ON from the controller is connected to the gate terminal of the transistor S1. Its drain is connected to the supply rail 26 and its source is connected to the output node 28. The other transistors S2 up to SN are similarly connected.

Optionally the controller has a third input 40 connected to the output node 28 for measuring a voltage VL occurring across the load 2.

Once the load is introduced into the circuit such that current flow can occur between the power supply 4 and the load 2, the connection device 6 commences current control during a first predetermined period. The first predetermined period starts as soon as current flow to the load becomes possible. During this time the controller 24 monitors the current flowing to the load by virtue of monitoring the voltage occurring across the current sensing resistor 20. Optionally, if the input 40 is connected to the output node 28, then the controller 24 also monitors the voltage across the load 2. The controller seeks to control the flow of current or optionally the rate of change of current flow to the load. This inevitably means that the voltage at node 28 will take some time to rise from zero to the power supply voltage Vs. The time permitted to do this may be set by the system designer. In broad terms the expected voltage across the current sensing resistor 20 should rise at a predetermined rate at as the current flow to the load increases. This voltage is monitored and controlled in a closed loop by controlling the gate voltage supplied to whichever one of the transistors S1 to SN is passing current at the time. This form of closed loop control is known to the person skilled in the art and does not need to be described in detail.

As can be seen, rather than having a single semiconductor device, such as FET 22 as shown in FIG. 1, the present invention has multiple current control transistors S1 to SN. These are activated by the controller 24 in a sequential, but interleaved manner. This means that the thermal stress caused during the hot swap power up event does not need to be endured by a single transistor, but can be shared between two or more transistors. This enables the circuit designer to use transistors which are optimised for their low on resistance in the fully on state which constitutes the vast majority of their working life, whilst ensuring that the transistors do not become damaged during a hot swap power up event.

Figure 3:
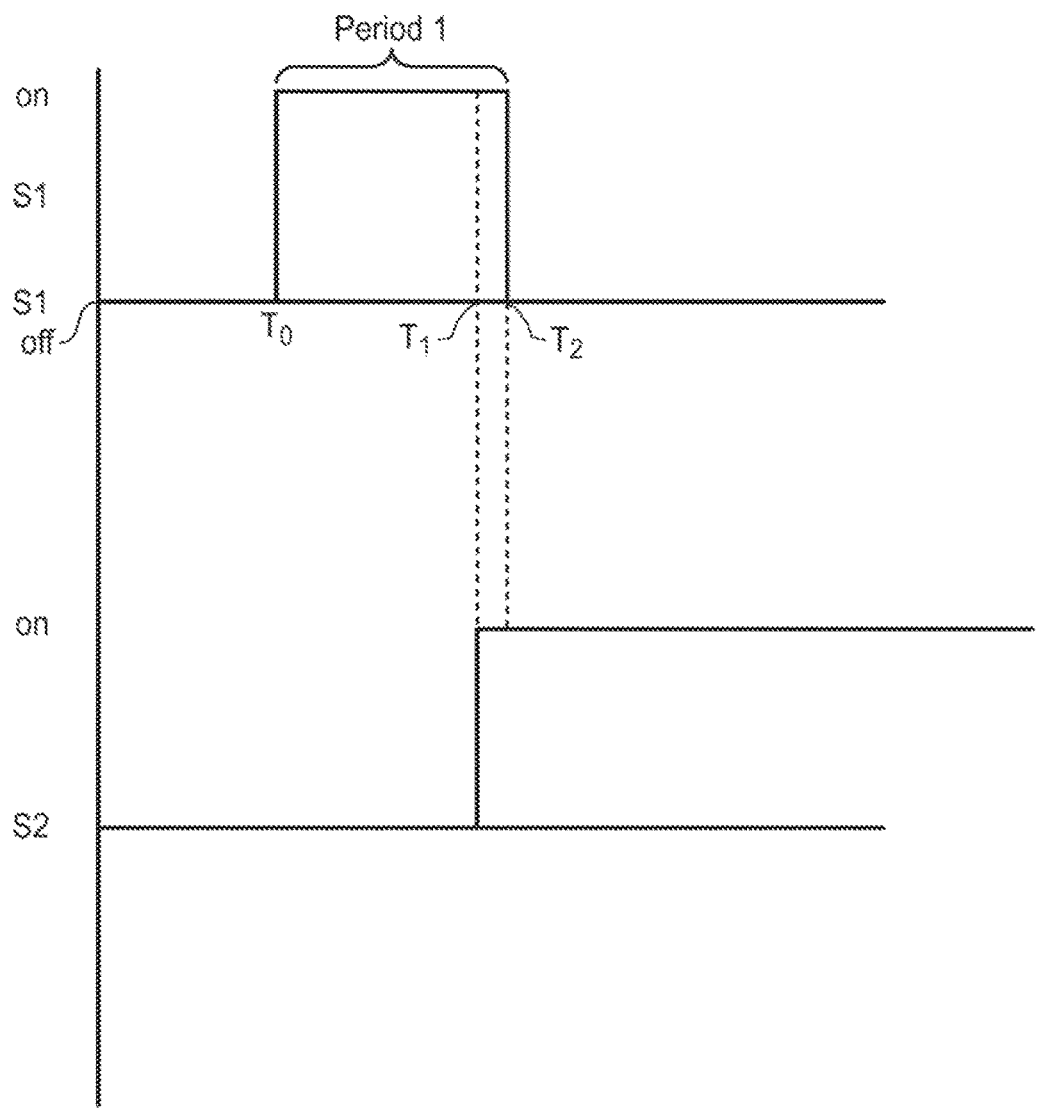
FIG. 3 is a timing diagram showing the periods for which the first and second transistors are conducting.

FIG. 3 is a timing diagram showing the time period for which a transistor is conducting during a hot swap event. For simplicity it will be assumed that the connection device as shown in FIG. 2 only comprises 2 semiconductor devices S1 and S2. Initially the load is not connected, but becomes introduced to the power supply at time T0. The controller 24 responds by switching the first device S1 on During this time the gate voltage of the first device S1 is modulated in order to control the current to the load. The evolution of gate voltage with respect to time will be described later.

A timer within the controller is started at time T0. The timer is arranged to count a predetermined time period, "period 1" which extends from T0 to T1 and which represents an individual device time limit during which only S1 is conducting. During this first predetermined time period, "period 1" the first current flow control device S1 has a changing voltage dropped across it and a changing current passing through it. The evolution of the voltage across S1 may not be known to the circuit designer, and it depends in part upon the specific performance of the load 2 or whether a load voltage monitoring path is provided. If load voltage monitoring is not provided the designer should assume the worst case scenario and set the first period accordingly. The worst case scenario is that the load 21 is faulty, for example a short circuit, such that the voltage across device S1 remains at the full supply voltage and that the current is at or ramps up to its maximum permissible value. This enables a circuit designer to calculate the amount of thermal stress applied to the first device S1 and to set "period 1" such that the first device S1 has not become damaged by its operation but has nevertheless made a useful and significant contribution to trying to power up the load if the load was good.

If the voltage across the load can be monitored, then this information can be used to calculate the voltage Vds across the transistor(s) as Vds=Vin−Vload. If the current is also known, for example because it is controlled to be a constant value, then the thermal stress on the transistor can be estimated and used to modify, e.g. extend, period 1.

At the end of the first period, period 1, the controller needs to hand over responsibility for conducting current from the first device S1 to the second device S2. In order to achieve this there is a transition period spanning from time T1 to time T2 when both the first and second devices are in conducting states and supplying current to the load. After time period T2 the first device S1 is switched off.

The transition between the current passing solely through the first device S1 to the current passing solely through the second device S2 must be respectful of the overall need to control the rate of change of current to the load.

Figure 4:
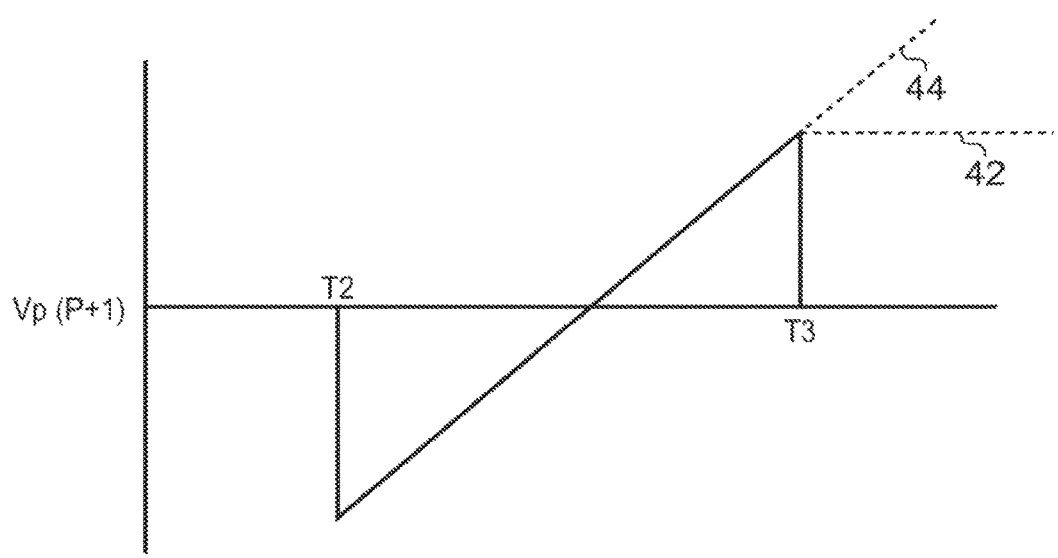
FIG. 4 illustrates a perturbation signal that may be added to a closed loop control signal supplied to a control terminal of the second transistor during a transition period.

In order to do this, a current control signal provided to the gates of the transistors S1 and S2 needs to be perturbed during a transitional period. An example of such a perturbation is illustrated in FIG. 4. Thus, at time T2 the control loop control voltage for the current control starts to be applied to the gate of transistor S2, in conjunction with the perturbation signal shown in FIG. 4. Since control is being passed from a first (P=1) to a second (P+1)th transistor, the perturbation signal can generically represented as $V_P(P+1)$. Thus, at time T2 the gate voltage on S2 is lower than the gate voltage on S1 such that all of the current flow at time T2 occurs through transistor S1. However the perturbation voltage rapidly evolves from period T2 to T3 such that the voltage at the gate of transistor S2 at time T3 is greater than the voltage at the gate of transistor S1 at time T2, and consequently all of the current is now flowing through transistor S2. At some time between T2 and T3 the effect of the changing perturbation voltage causes the relatively smooth transitioning of current flow from transistor S1 to S2. The exact moment and rate at which this occurs depends on the respective device characteristics which may not be known to the circuit designer. The perturbation signal can be removed at time T3 if some other provision is made for keeping transistor S1 in a known conducting state, i.e. substantially off once S2 is switched on and is responsible for substantially all of the current flow. However the perturbation signal may itself be used to keep transistor T1 in a substantially non-conducting state, and this can be done by holding the perturbation signal on. This continuation of the perturbation signal may be at a substantially constant value as indicated by the chain line 42 or as a ramp as indicated by the chain line 44. In either case the feedback loop acts the maintain the current at a target value.

Figure 5:
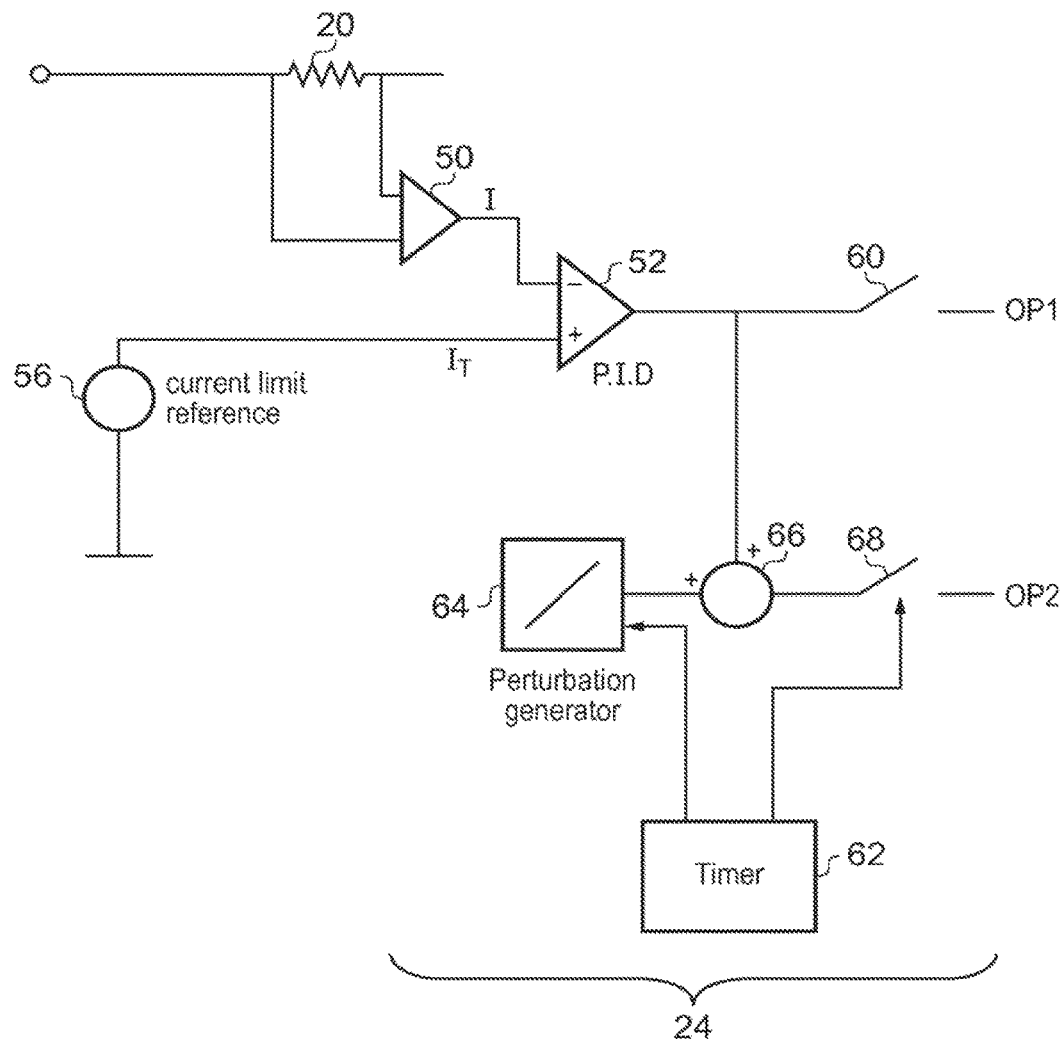
FIG. 5 is a circuit diagram of a connection device arranged to control the current to a load.

FIG. 5 schematically illustrates the internal configuration of the controller 24 of FIG. 2 in greater detail for the simplified case where the first and second transistors S1 and S2 need to be driven and hence only first and second outputs OP1 and OP2 need to be formed.

The controller 24 comprises a current sensing amplifier 50 responsive to the voltage difference across the current sensing resistor 20. An output of the amplifier 50, which represents the measured current, is provided to a first input of a feed back controller 52 which may be a proportional, integral, differential (PID) controller or any combination of proportional, integral or differential terms. The PID controller 52 also receives a target current $I_T$ representing the instantaneous current flow to the load 2. The instantaneous current may be set to a limit value by a current limit reference 56 or may be allowed to evolve with time and can be formed by integrating a rate of change of current value. The PID controller 52 compares the instantaneous current I with the target instantaneous current $I_T$ and generates an output voltage which is selectively applied to the gates of S1 or S2 in order to cause the relevant transistor to pass more current or to pass less current. During the first period, period 1, the output of the PID controller 52 is connected to the output node OP1 by way of an electrically controllable switch 60.

At the initiation of current flow a timer 62 is started which counts down the first period, period 1, for which the transistor S1 is to be used. At the end of this period, period 1, timer 62 sends a signal to initiate a perturbation generator 64 which generates a ramping perturbation that is added to the output of the ND controller 52 by a summer 66 and provided to the second output node OP2 via a switch 68. The switch 68 is closed (made conducting) at the end of period 1. Thus, at the end of period 1 the output signal from the PID controller 52 is provided to the first transistor S1, and also a version of it, but with a reduced value is provided to the second transistor S2 via output OP2. As shown in FIG. 4 the perturbation initially causes the voltage at OP2 to be less than that at OP1, but it quickly rises such that the voltage at OP2 is greater than that at OP1. Therefore current flow passes from the first transistor S1 to the second transistor S2 within the transition period extending from T2 to T3. There is a period during the transition period where both transistors are conducting, but the action of the closed loop around the PID controller causes the control voltages to the transistors to be reduced in order to compensate for this. Once the second transistor is conducting substantially all of the current then the first transistor S1 can be switched off, for example by opening switch 60 and taking the gate to a low voltage.

Though, for simplicity, switches 60 and 68 have been shown in FIG. 5 as being in series with the output paths, it will be apparent that in reality these switches 60 and 68 could be omitted and both OP1 and OP2 can be powered all the time if the perturbation provided by the perturbation generator 64 is permanently applied. Thus if during the first period perturbation generator 64 outputs a constant negative value, such that voltage at OP2 is sufficiently less than that at OP1 to ensure that transistor S2 does not conduct, then the absence of the switch has no effect. Similarly, at the end of the transition period if the voltage at OP2 is sufficiently above the voltage OP1 such that it can be guaranteed that the first transistor S1 is not conducting, then the switch 60 can be omitted. This approach can be used where more than two transistors are provided.

It is also apparent that the perturbation generator 64 need not be connected to provide a perturbation to the second output OP2 but could instead provide a perturbation to the output OP1 such that OP1 is held artificially high by the perturbation signal during the first period P1 and then reduced in value during the transitional period between T2 and T3. This latter approach may be easier to implement than silicon because then the perturbation signal can be arranged between a positive voltage and zero. The perturbation signal does not alter the current to the load because the feedback loop operates to control the current to match the target value.

Figure 6:
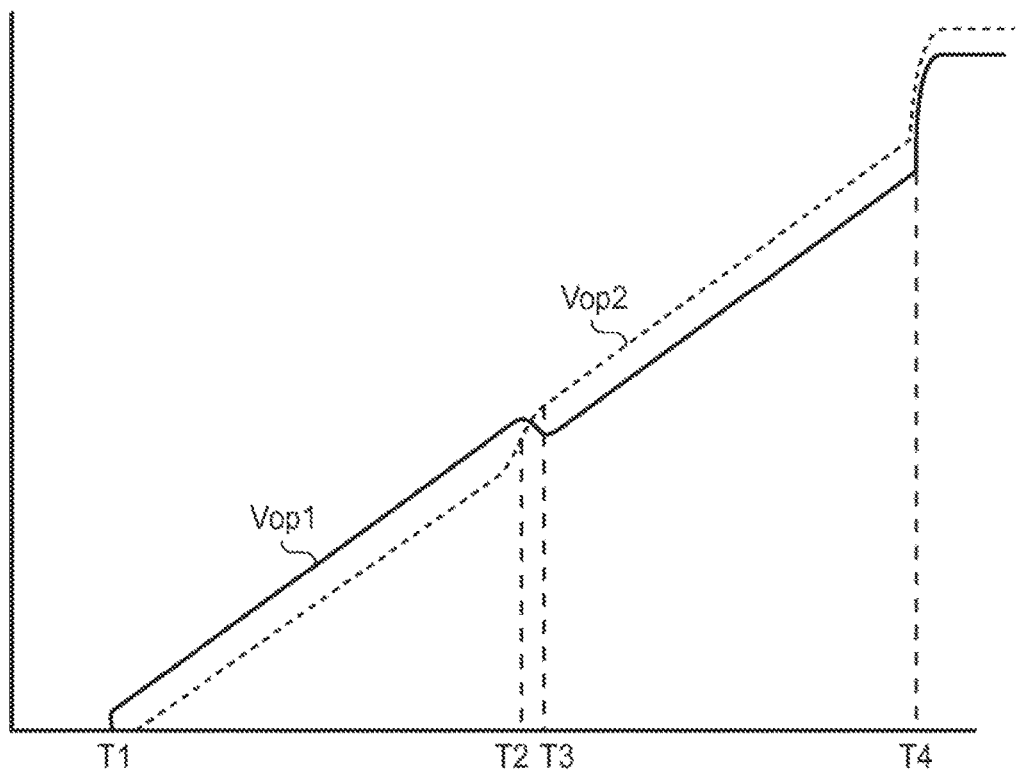
FIG. 6 schematically illustrates the evolution of control voltages for the first and second transistors with respect to time.

FIG. 6 shows the evolution of the voltages VOP1 at the output OP1 and VOP2 at the output OP2 as a function of time for a circuit like that shown in FIG. 5, but where the switches 60 and 68 have been omitted and replaced with conductors. Thus, following introduction of the load to the power supply at T1, the output voltage VOP1 supplied to the first transistor S1 rises substantially uniformly during the first period extending between T1 and T2. VOP2 tracks VOP1, but at a reduced value. At time period T2 the perturbation generator 64 controlled such that a perturbation voltage ramps from a negative value to a positive one such that VOP2 becomes greater than VOP1. During the time period T2 to T3 the rate of change of VOP2 is greater than that of VOP1 and at some point in this period the transistor S2 starts to conduct and current flow of transitions from being via transistor S1 to being via transistor S2 such that by time T3 all of the current flow is via the transistor S2. VOP2 then continues to evolve from T3 until such time as the node is fully powered at T4 where the voltage across the load has reached that of the supply voltage. At this time the transistor S2 is driven hard on as the control loop tries, and fails, to keep the current to the load at the current limit reference value. The voltage drop across S2, and indeed across S1, becomes negligible.

Although the controller has been described to FIG. 5 in terms of analog components, it will be apparent to the person skilled in the art that similar functionality can be achieved in the digital domain by use of suitably programmable digital circuits and digital to analog converters, and analog to digital converters. Such an implementation is particularly suitable Where the connection device is provided as part of the power supply or as an intermediate unit. Thus any logic circuitry will have had time to power up and initialise before the load is supplied with power.

Teaching of swapping the current flow between the first and second transistors as described herein with respect to FIGS. 4, 5 and 6 can be extended such that the transitions between a second and third, third and fourth, and so on transistors can also be achieved.

This patent application was drafted for first filing at the USPTO where singularly dependent claims are the norm. However for other jurisdictions where multiply dependent claims are allowed it is to be assumed that unless it is not technically feasible, that any dependent claim may depend on any preceding dependent claims where all those claims refer back to the same independent claim.

What is claimed is:

1. A method for controlling a power-up voltage ramp of a load using parallel connected switches, each switch of the parallel connected switches configured to intermittently operate in a manner that thermally stresses the switch, the method comprising:
   turning on a first switch of the parallel connected switches to provide power to the load;
   operating the first switch at an operating point configured to expose the first switch to thermal damage after a first interval;
   monitoring an indication of thermal stress of the first switch while the first switch is providing power to the load; and
   turning off the first switch before the first interval and turning on a second switch of the parallel connected switches to avoid damage to the first switch if the indication is above a threshold.

2. The method of claim 1, wherein the monitoring includes determining the indication of thermal stress of the first switch and comparing the indication of thermal stress to the threshold.

3. The method of claim 2, wherein the determining includes integrating a power dissipation of the first switch to provide the indication.

4. The method of claim 3, wherein the monitoring including:
   receiving an input voltage at a first input of a controller, sensing a load voltage at a second input of the controller; and
   subtracting the input voltage from the load voltage to provide an indication of a voltage across the first switch.

5. The method of claim 4, wherein the monitoring includes receiving an indication of current supplied to the load via the first switch at the controller.

6. The method of claim 5, wherein the monitoring includes multiplying the indication of voltage across the switch with the indication of current supplied to the load to provide the power dissipation of the first switch.

7. The method of claim 1, including:
   initiating a timer upon the turning on of the first switch, the timer configured to time a second interval;
   if the first switch is on when the timer expires at the conclusion of the second interval, turning off the first switch and turning on a second switch of the parallel connected switches; and
   wherein the second interval is shorter than the first interval.

8. A hot-swap circuit for controlling a power-up voltage ramp of a load using parallel connected switches, each switch of the parallel connected switches configured to intermittently operate in a manner that can cause thermal damage to the switch, the hot-swap circuit comprising:
   first and second outputs configured to couple to control inputs of corresponding first and second switches, the corresponding first and second switches configured to provide power to the load; and
   a controller configured to:
   turn on the corresponding first switch via the first output according to the power-up voltage ramp,
   to turn on the corresponding first switch using the first output to an operating point configured to expose the first switch to thermal damage after a first interval,
   to measure a stress level of the first switch while the first switch is controlled, via the first output, at the operating point,
   to turn off the corresponding first switch, via the first output, to avoid damage to the first switch based on a state of the stress level, and
   to turn on the corresponding second switch via the second output.

9. The hot-swap circuit of claim 8, wherein the controller is configured to determine an indication of thermal stress of the corresponding first switch when the corresponding first switch is on and to compare the indication with a threshold to determine the stress level of the corresponding first switch.

10. The hot-swap circuit of claim 9, wherein the controller is configured to integrate a power dissipation of the corresponding first switch to provide the indication of thermal stress.

11. The hot-swap circuit of claim 10, wherein the controller is configured to:
    receive an input voltage at a first input;
    receive a voltage of the load at a second input;
    to determine a difference between the input voltage and the voltage across the load to provide an indication of the voltage across the corresponding first switch.

12. The hot-swap circuit of claim 11, wherein the controller is configured to receive an indication of current supplied to the load via the corresponding first switch.

13. The hot-swap circuit of claim 12, including a current sense resistor configured to provide the indication of current supplied to the load via the corresponding first switch.

14. The hot-swap circuit of claim 12, wherein the controller is configured to multiply the indication of the voltage across the corresponding first switch with the indication of current supplied to the load via the corresponding first switch to provide the power dissipation of the corresponding first switch.

15. The hot-swap circuit of claim 8, including a timer configured to initiate when the corresponding first switch is turned on and to time a second interval while the first switch is on; and
    wherein, if the first switch is on when the second interval times out, the controller is configured to:
    turn off the corresponding first switch, to turn on the corresponding second switch via the second output according to the power up voltage ramp, and
    to turn on the corresponding second switch via the second output at an operating point configured to thermally damage the corresponding second switch after a third interval.

16. The hot-swap circuit of claim 8 wherein the first and second outputs provided by the control circuit are configured to establish a monotonically-increasing load voltage using the corresponding first and second switches.

17. The hot-swap circuit of claim 8, wherein the controller is configured to inhibit conduction by the corresponding first and second switches using the first and second outputs when a load current increase persists for longer than a specified duration.

18. The hot-swap circuit of claim 8, wherein the controller is configured to inhibit any one of the first or second switches from conducting the load current for a duration longer than a specified duration.

19. The hot-swap circuit of claim 8, wherein the specified duration is determined at least in part using information about a stress on the corresponding first or second switch.

20. The hot-swap circuit of claim 19, wherein the stress is determined using information about a voltage drop across the corresponding first or second switch.

* * * * *